(12) United States Patent
Perner

(10) Patent No.: US 7,102,948 B2
(45) Date of Patent: Sep. 5, 2006

(54) RESISTANCE CHANGE SENSOR

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

(21) Appl. No.: 10/816,482

(22) Filed: Apr. 1, 2004

(65) Prior Publication Data

US 2005/0226034 A1 Oct. 13, 2005

(51) Int. Cl.
*G11C 7/02* (2006.01)
(52) U.S. Cl. ...................... 365/209; 365/207
(58) Field of Classification Search ................ None
See application file for complete search history.

(56) References Cited

U.S. PATENT DOCUMENTS

| | | | | |
|---|---|---|---|---|
| 4,818,977 A * | 4/1989 | Alexander | ................ | 340/633 |
| 6,584,011 B1 * | 6/2003 | Watanabe | .................... | 365/158 |
| 6,606,262 B1 | 8/2003 | Perner | | |
| 6,778,426 B1 * | 8/2004 | Hosotani | .................... | 365/158 |
| 6,781,873 B1 * | 8/2004 | Ishikawa et al. | ............ | 365/158 |
| 6,903,965 B1 * | 6/2005 | Ishikawa | .................... | 365/158 |
| 2005/0083747 A1 * | 4/2005 | Tang et al. | ................. | 365/210 |

* cited by examiner

*Primary Examiner*—Son Mai

(57) ABSTRACT

An embodiment includes a resistance change sensor. The resistance change sensor includes a first input connected to a first resistance and a second input connected to a second resistance. The sensor further includes a resistance detector for sensing a resistive change in at least one of the first resistance and the second resistance.

23 Claims, 14 Drawing Sheets

RESISTANCE CHANGE SENSOR

CROSS-REFERENCE TO RELATED APPLICATION

This patent application is related to U.S. patent application to Fred Perner, entitled "An Apparatus and Method for Generating a Write Current for a Magnetic Memory Cell", having USPTO Ser. No. 10/658,442, filed on Sep. 8, 2003.

FIELD OF THE INVENTION

The invention relates generally to electronic memory. More particularly, the invention relates to a resistance change sensor.

BACKGROUND OF THE INVENTION

Non-volatile memory is memory that retains its content (data) even when power connected to the memory is turned off. Magnetic random access memory (MRAM) is a type of non-volatile memory. A logical state, or bit, is stored in MRAM by setting magnetic field orientations of MRAM cells within the MRAM. The magnetic field orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. These two orientations, are either parallel or anti-parallel to the magnetic orientation of the hard magnetic region 110, and determine the logical state of the MRAM memory cell 100. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell is generally located proximate to a crossing point of a word line (WL) and a bit line (BL). The magnetic orientations of the MRAM memory cells are set (written to) by controlling the directions of electrical currents flowing through the word lines and the bit lines, and therefore, by the corresponding magnetic fields induced by the electrical currents. Additionally, the write lines can also be used to read the logic value stored in the memory cells.

The MRAM memory cells are read by sensing a resistance across the MRAM memory cells. The resistance is sensed through the word lines and the bit lines. Generally, the resistance (and therefore, the logical state) of a magnetic memory cell depends on the relative orientations of magnetization in the data layer and the reference layer. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. The magnitude of the switching field required to switch the state of the magnetic memory cells can change over time, further complicating processes for switching the states of the magnetic memory cells.

FIG. 2 shows an array 210 of MRAM memory cells. Bit line and word line selections are made by a row decoder 220 and a column decoder 230, which select a memory cell by conducting current through a selected bit line (BL) and a selected word line (WL). For example, a memory cell 250 is selected by conducting current though a selected bit line 260 and a selected word line 270. The induced magnetic fields should be great enough to reliably set the orientation of magnetization of the selected memory cells of the array of MRAM memory cells 210. The logical states of the memory cells are sensed through corresponding word lines and bit lines by a sense amplifier 240.

The array 210 of MRAM memory cells can suffer from half-select errors when writing to the memory cells. Writing to the memory cells includes selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory. The write current to the memory cells should be controlled from being so large that excessive half-select errors occur.

It is desirable to minimize half-select errors of MRAM memory cells within arrays of MRAM memory cells by ensuring that the write current applied to the memory cells is not too large. Additionally, it is desirable ensure that the write current is great enough to provide consistent writing to the memory cells.

SUMMARY OF THE INVENTION

An embodiment of the invention includes a resistance change sensor. The resistance change sensor includes a first input connected to a first resistance and a second input connected to a second resistance. The sensor further includes a resistance detector for sensing a resistive change in at least one of the first resistance and the second resistance.

Another embodiment of the invention includes a magnetic sensing device. The device includes a first sensor input connected to a first tunneling magneto-resistive junction (TMJ) cell, the first TMJ cell including a first resistance. The device further includes a second sensor input connected to a second TMJ cell, the second TMJ cell including a second resistance. The device further includes a detector for sensing a change in resistance of the first TMJ cell and the second TMJ cell.

Another embodiment of the invention includes a memory apparatus. The memory apparatus includes an array of MRAM cells. A write current generator generates a write current for selectively writing to MRAM cells within the array of MRAM cells. A complimentary pair of test MRAM cells is coupled to the write current of the write current generator. A complimentary MRAM cell resistive state sensor is connected to the complimentary pair of test MRAM cells for detecting a change in resistance of the complementary pair of test MRAM cells, and feeding detected changes back to the write current generator.

Other aspects and advantages of the present invention will become apparent from the following detailed description, taken in conjunction with the accompanying drawings, illustrating by way of example the principles of the invention.

DETAILED DESCRIPTION

The invention includes a sensor for sensing a resistive change in at least one of two resistances. The sensor can be used for sensing the presence of magnetic fields when the resistances are tunnel magneto resistive junctions (TMJ). The TMJ junctions can include MRAM cells that are used within write control circuitry of an array of MRAM cells.

Figure 1:
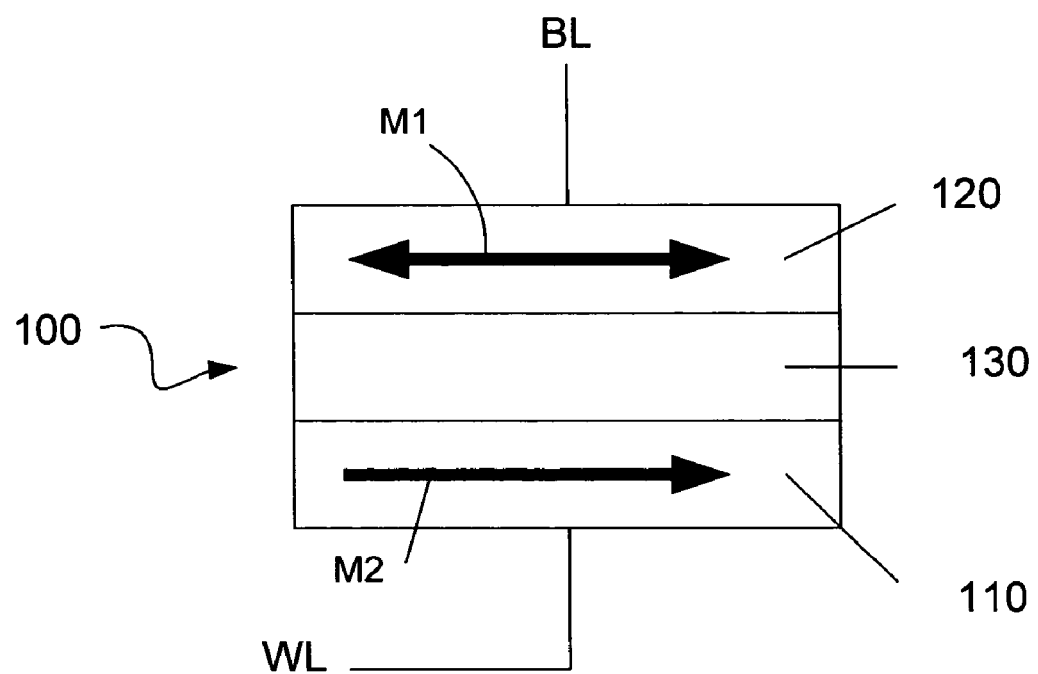
FIG. 1 shows an MRAM memory cell.
Figure 2:
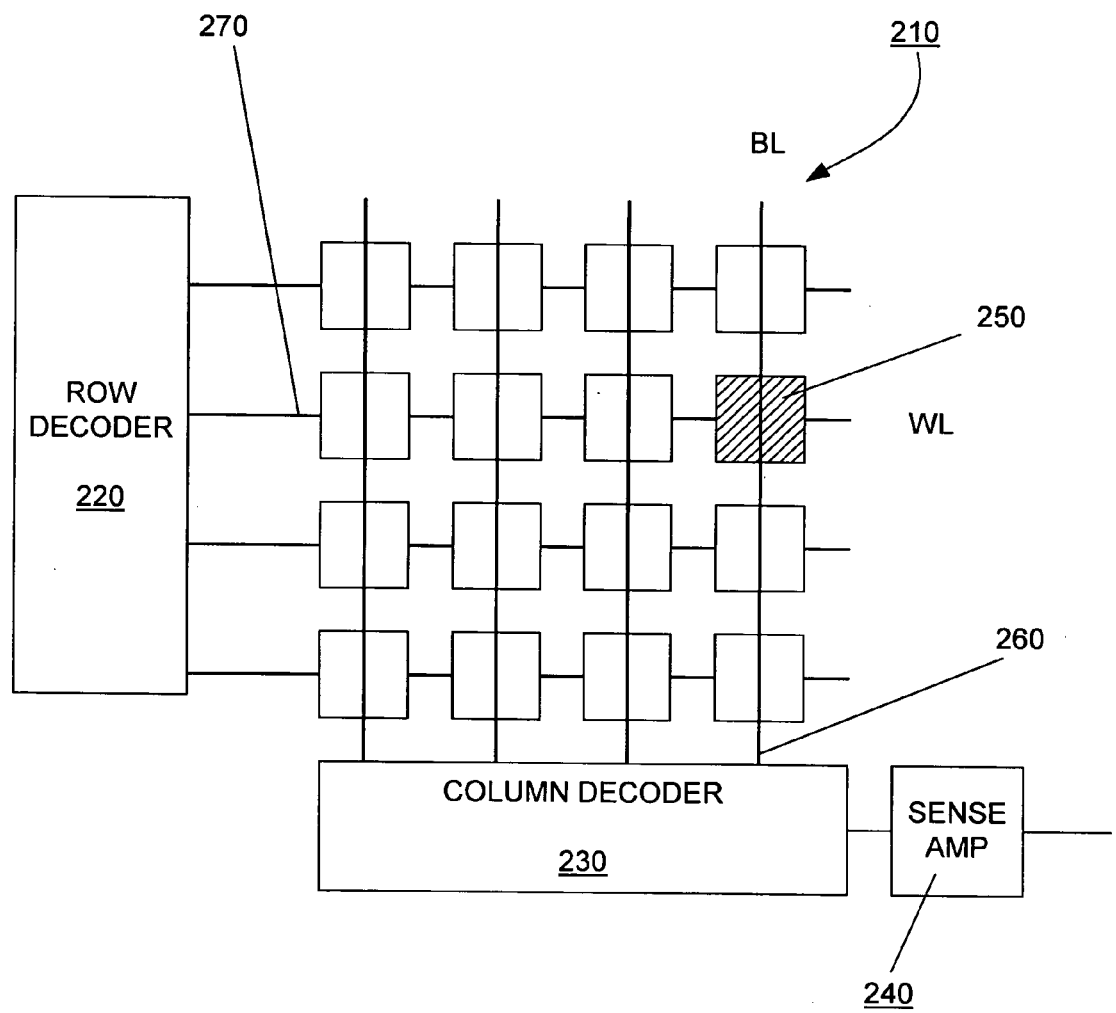
FIG. 2 shows an array of MRAM memory cells.
Figure 3:
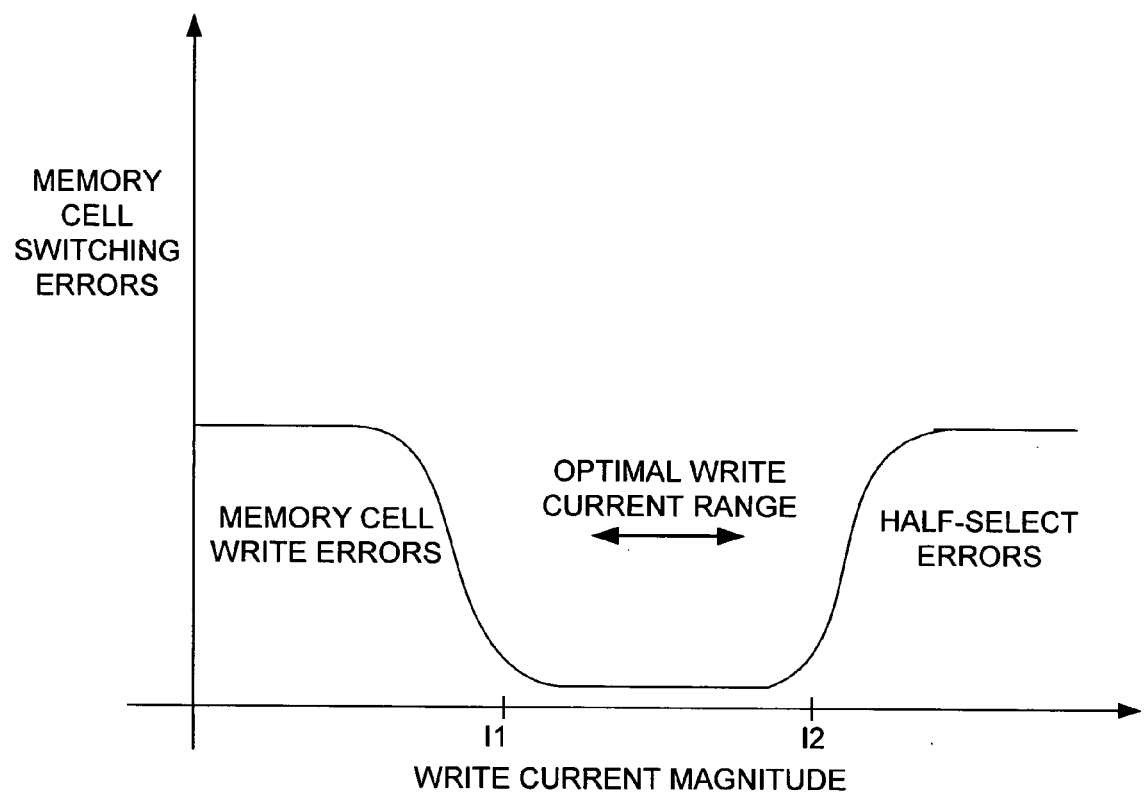
FIG. 3 is a plot showing a relationship between magnetic memory write current and possible memory write errors.

FIG. 3 is a plot showing a relationship between magnetic memory write current and possible magnetic memory write errors. FIG. 3 shows that when the write current is below a first threshold current (I1), then memory cell write errors occur. If the write current is below the first threshold (I1), the magnetic field created by the write current is too small to consistently write to the memory cells.

FIG. 3 shows that if the write current to a magnetic memory cell within an array of magnetic memory cells is greater than a second threshold current (I2), then magnetic memory cells within the array are likely to suffer from half select errors. Half-select errors occur when a memory cell associated with a selected bit line and a non-selected word line changes states, or when a memory cell associated with a non-selected bit line and a selected word line changes states. Generally, half-select errors occur when the magnitude of the write current is too large, and more memory cells than the desired memory cell are magnetically induced to change states.

As suggested by FIG. 3, there is generally an optimal range of write current for magnetic memory cells within an array of magnetic memory cells. The optimal range is great enough to reliably write to a magnetic memory cell, but low enough to minimize half-select errors within the array of magnetic memory cells.

Figure 4:
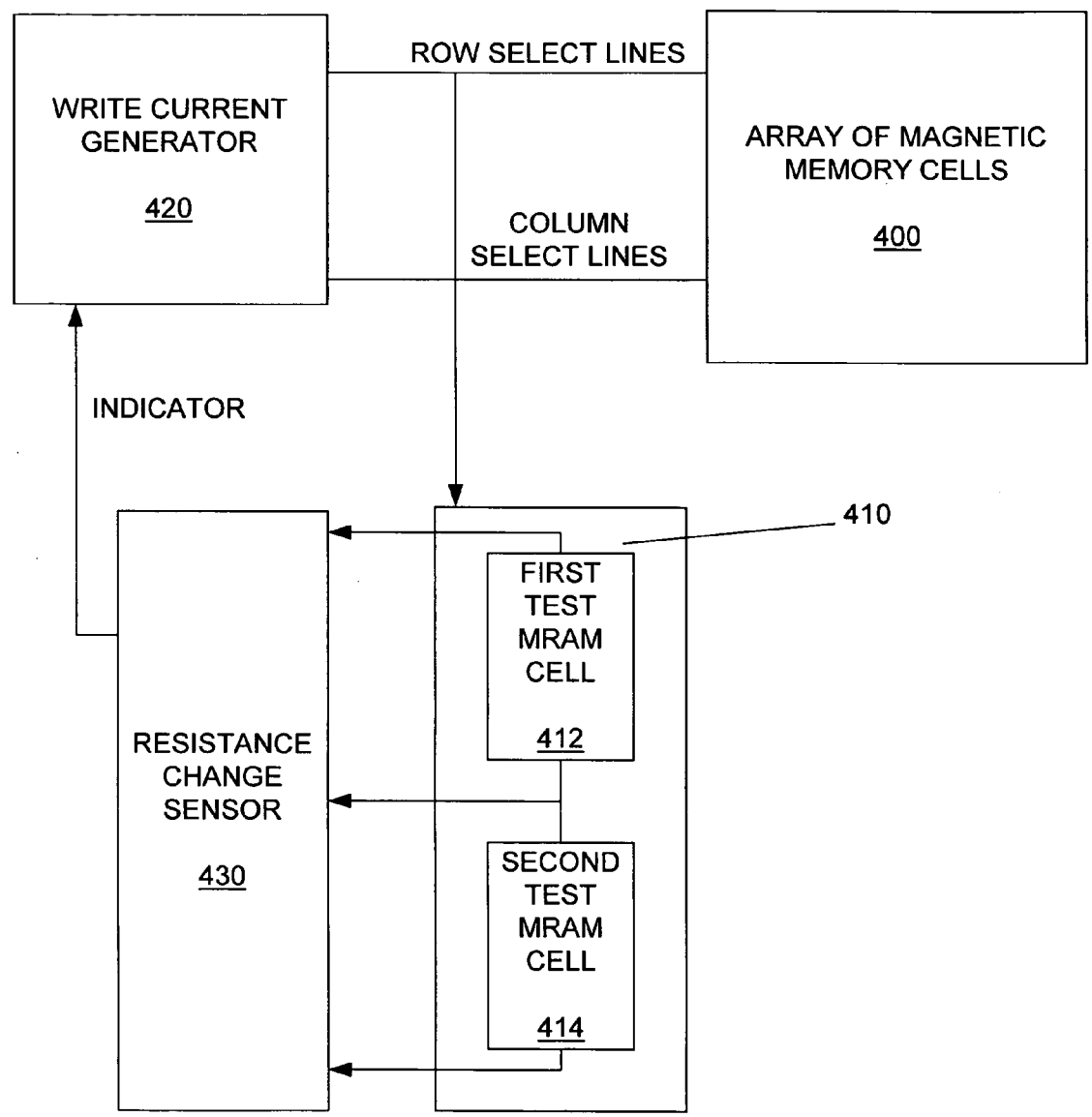
FIG. 4 shows an example of a write current generator utilizing a resistance change sensor, according to an embodiment of the invention.

FIG. 4 shows one example of an array of magnetic memory cells 400 that includes a write current generator 420, a pair 412, 414 of test memory cells 410, and a resistance change sensor 430. The write current generator 420 generates a write current for writing to selected memory cells within the array of magnetic memory cells 400. The test memory cells 410 in conjunction with the resistance change sensor 430 can generate feedback to the write current generator 420 for ensuring the write current is great enough to reliably write to the memory cells within the array of magnetic memory cells 400, but not so great that half select errors occur. An output (INDICATOR) of the resistance change sensor 430 is connected to the write current generator.

The test memory cells 410 switch magnetic orientations based upon a magnitude of the write current generated by the write current generator 420. The combination of the test memory cells 410 and the resistance change sensor 430 provide feed back to the write current generator 420 which can be used to determine whether the write current generated by the write current generator should be increased or decreased. Algorithms can be developed to test the write current generated by the write current generator 420. One example of a write current algorithm includes averaging or weighted averaging of a minimum threshold write current and a maximum threshold write current.

The test memory cells 410 are formed in a complementary configuration. That is, the cells are oriented so that an applied magnetic field causes the first test cell 412 to have the opposite magnetic orientation as the second test cell 414. The resistive difference provided by the pair of test memory cells is approximately twice as large as the resistive difference provided by a single test memory cell. The greater resistive difference provided by the complimentary pair is more easily sensed, than the resistive difference provided by a single test memory cell.

FIG. 4 includes a single connection between the row select lines and the test memory cells 410. This configuration assumes that the write current of the column select line is set. An alternate embodiment could include the write current of the column select line also being connected to a test memory cells 410 to provide additional write current calibration.

Figure 5:
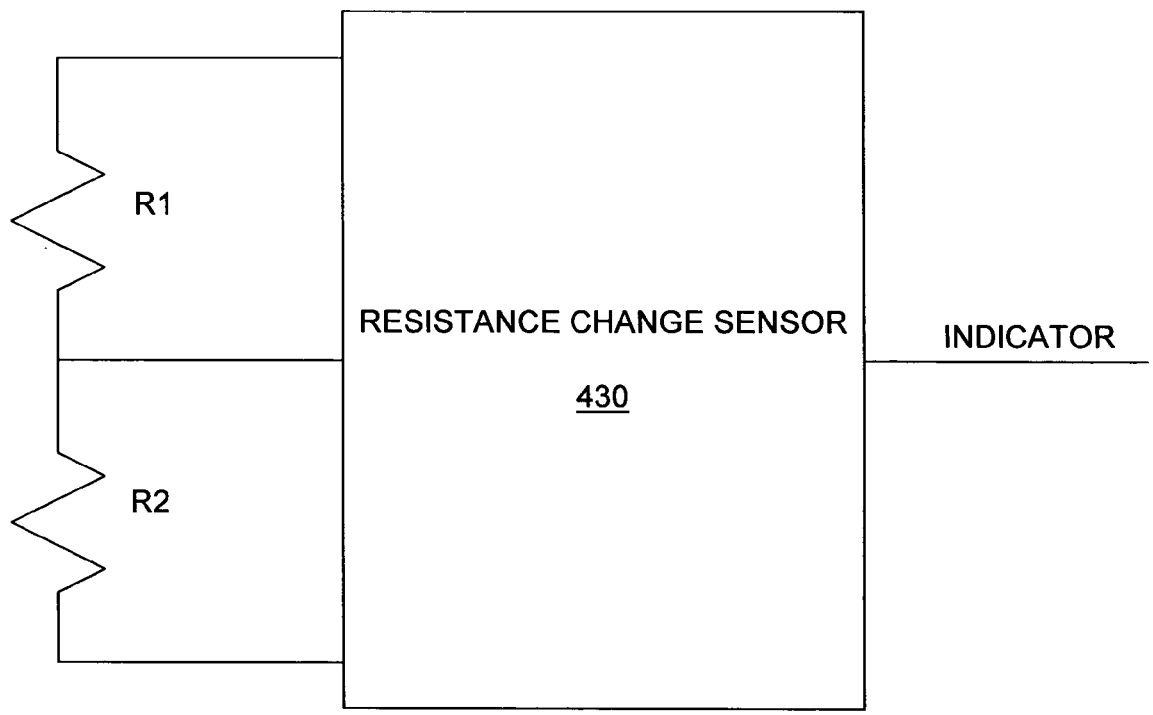
FIG. 5 shows a resistance sensor according to an embodiment of the invention.
Figure 7:
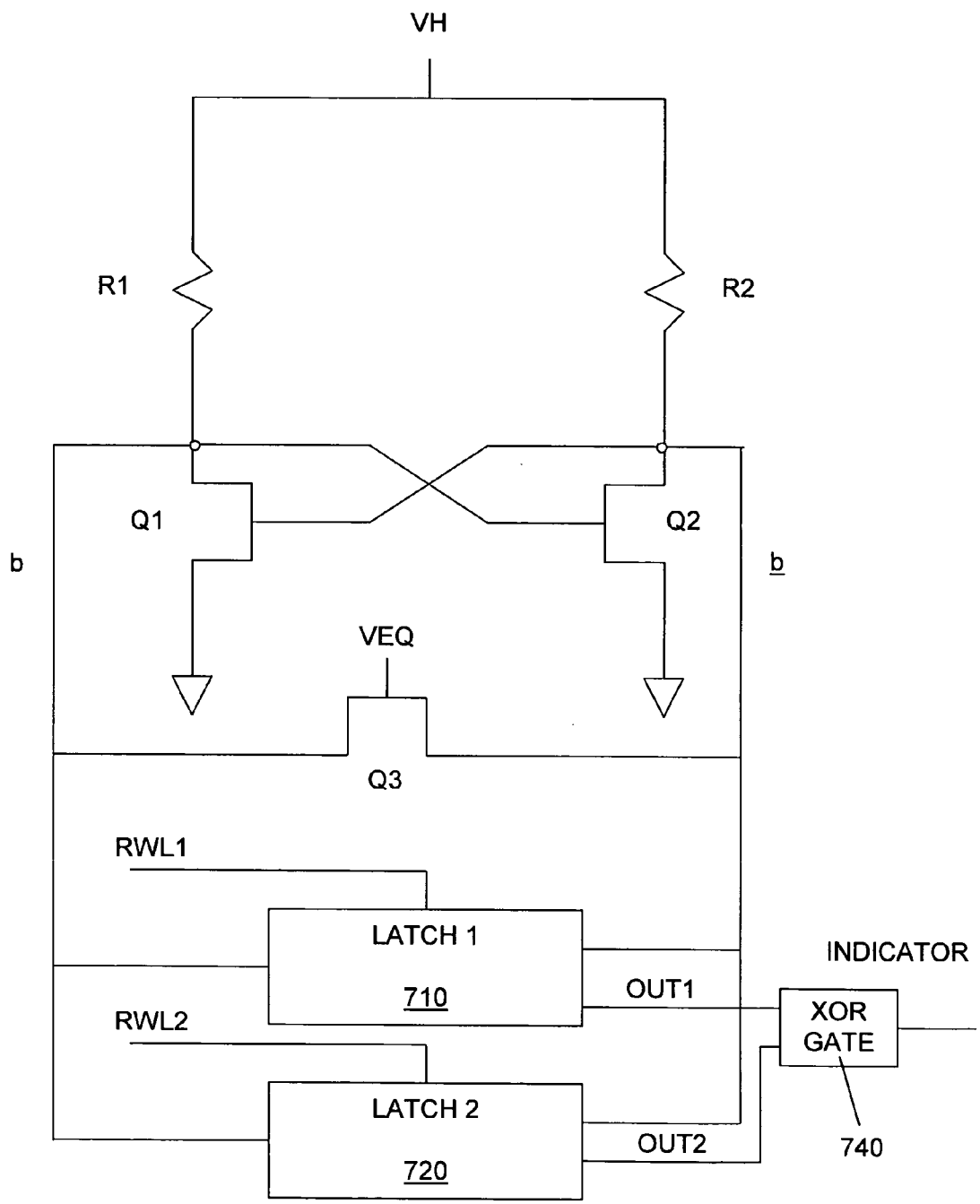
FIG. 7 shows greater detail of a TMJ resistance sensor according to an embodiment of the invention.

FIG. 5 shows one example of a resistance change sensor. The resistance change sensor includes a first input connected to a first resistance R1, and a second input connected to a second resistance R2. A resistance detector 430 senses a resistive change in at least one of the first resistance R1 or the second resistance R2, and an output indicator that indicates when the resistance change sensor detects a change in the resistances. FIG. 7 shows one example of circuitry that can be included within the resistance detector 430.

The write current generator of FIG. 4 can utilize the resistance change sensor for sensing the magnetization states of the test memory cells. However, the resistance change sensor can be utilized with any type of resistance sensitive devices. Such devices include chemical-resistance sensitive devices, pressure-resistance sensitive devices (piezo-electric devices), temperature-resistance devices (simple resistors, pyro-resistive devices) and photo-resistive devices (photo cells). Any combination of the listed resistance sensitive devices that include a changing resistance while in operation can utilize the resistance change sensor of FIG. 5.

Figure 6:
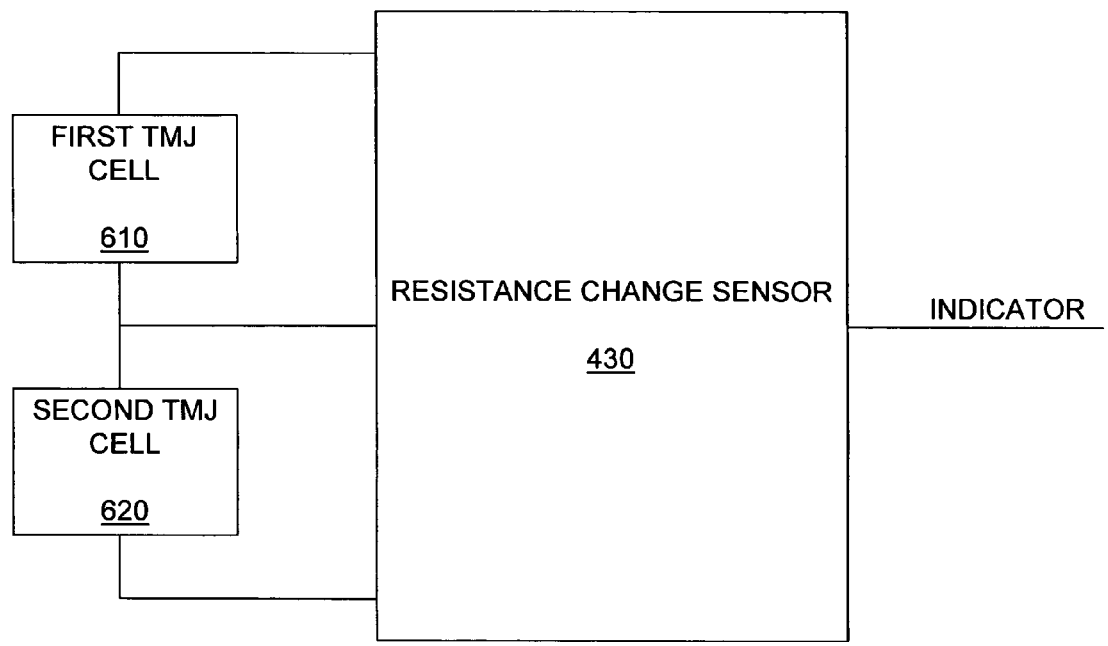
FIG. 6 shows TMJ resistance sensor according to an embodiment of the invention.

FIG. 6 shows one example of a magnetic sensing device. The magnetic sensing device includes a first sensor input connected to a first tunneling magneto-resistive (TMJ) cell 610, the first TMJ cell 610 including a first resistance. A second sensor input is connected to a second TMJ cell 620, the second TMJ cell including a second resistance. A resistance detector 430 senses a change in resistance of the first TMJ cell and the second TMJ cell. FIG. 7 shows one example of circuitry that can be included within the resistance detector 430.

The TMJ cells 610, 620 can include any type of tunnel magneto-resistive junction device, such as, an MRAM device. Functionally, the cells provide a resistance that can vary when subjected to a magnetic field. The first TMJ cell and the second TMJ cell are formed complimentary to each other so that when one of the TMJ cells has one magnetic orientation, the other TMJ cell has the opposite orientation. Therefore, the resistance difference between the two is maximized. This provides for the easy detection of the change in resistance of the TMJ cells due to detection of a magnetic field.

FIG. 7 shows detail of one example of a resistance sensor. The resistances are incorporated as load resistors R1, R2 of a cross-coupled pair of transistors Q1, Q2 forming a differential pair amplifier of the resistance change sensor. The load resistors R1, R2 are connected to a control voltage VH, and to the pair of transistors Q1, Q2. If the resistances are complimentary TMJ cells, then the two TMJ cells are oriented so that the magnetizations of the TMJ cells are always in opposite directions. When one TMJ cell is in a high-resistance state, the other TMJ cell is in a low-resistance state. This relationship ensures that one of the cross-coupled pair of transistors Q1, Q2 is always conducting more current than the other of the cross-coupled pair of transistors Q1, Q2.

The differential pair of transistors Q1, Q2 are connected to a first latch 710 and second latch 720 through output lines designated as b and b̲. The dual connection of b and b̲, provides twice the voltage potential swing as a single input would provide. Connecting only a single one of the outputs b, b̲, to the latches 710, 720 provides half the available signal swing, which is harder to detect.

A state of the differential pair Q1, Q2 is stored in the first latch 710 at a first sample time t1, and another state of the differential pair is stored in the second latch 720 at a second sample time t2. A first control line RWL1 determines the sampling time t1 of the first latch 710, and a second control line RWL2 determines the sampling time t2 of the second latch 720. If the state at the first sampling time t1 is different than the state at the second sampling time t2, an exclusive OR gate 740 provides a signal (INDICATOR) indicating the first latch 710 has stored a different state than the second latch 720.

Before sampling states of the differential pair, the differential pair can be initialized with an equalization control line (VEQ). Turning on an equalization transistor Q3 forces the outputs of the differential pair to be equal. To begin sampling, the control line is deactivated, and the equalization transistor Q3 is turned off.

The sampling of the state of the differential pair Q1, Q2 is generally continually repeated, and any change in the state of the differential pair Q1, Q2 causes different states to be latched into the latches 710, 720. This generates an affirmative output of the indicator (INDICATOR) output because the exclusive OR gate receives the different states of the latches 710, 720. The sampling can be repeated over and over and resistance changes sensed by monitoring differences in the states at sample times t1 and sample times t2. That is, the sampling can include a sampling sequence that includes a first sample, detection, a second sample, detection, and so forth, continuously.

Figure 8:
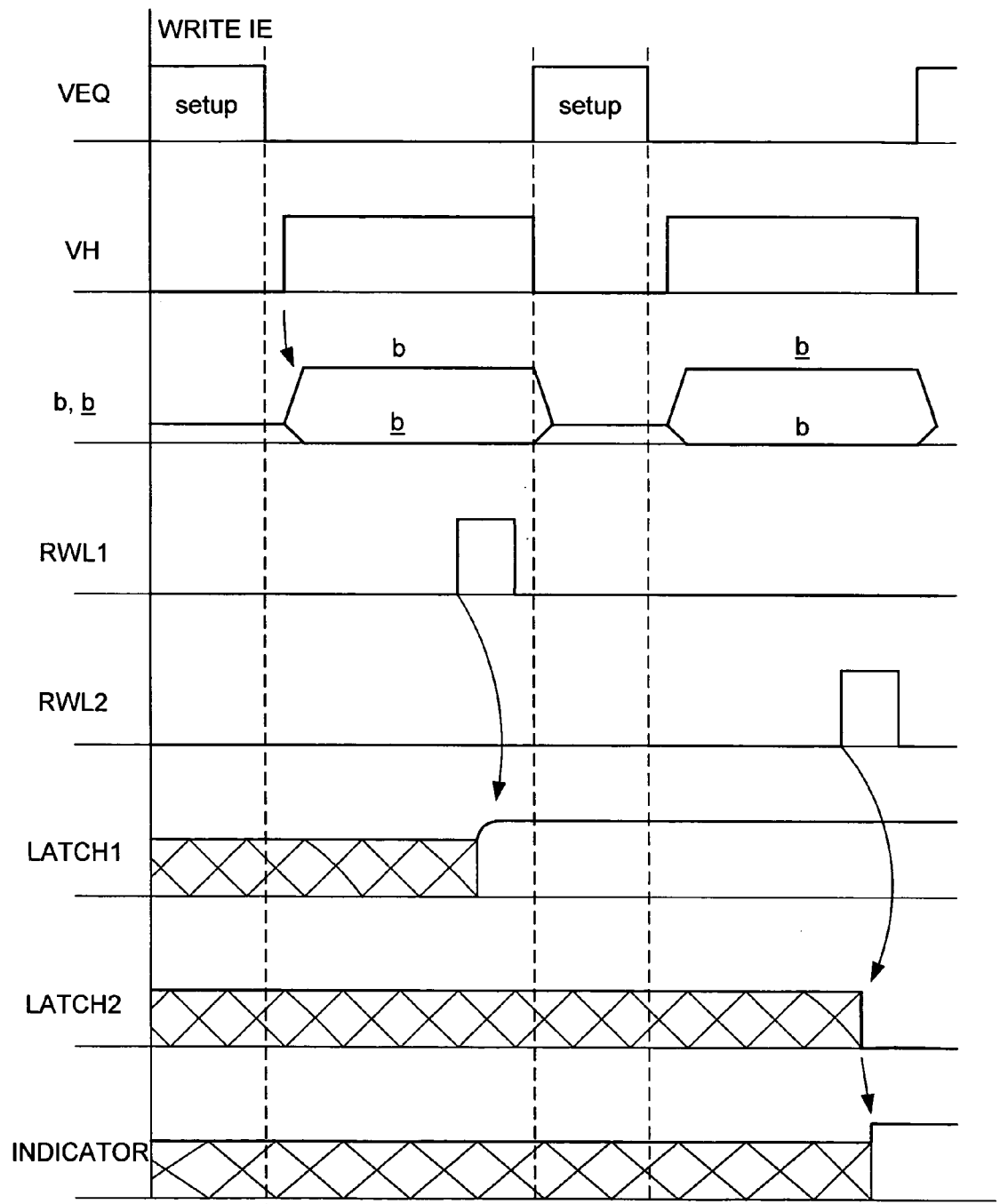
FIG. 8 shows time lines of signals and control lines of the resistance sensor of FIG. 7.

FIG. 8 shows time lines of signals and control lines of the resistance sensor of FIG. 7. The resistance change sensing is initiated by pulsing the VEQ control line forcing the two outputs of the differential pair Q1, Q2 to be the same (setup). The VEQ control line is de-asserted, and the VH control line is asserted causing at least one of the two differential pair transistors Q1, Q2 to turn on. The transistor that initially turns on is dependent upon which of the two load resistors is in a high-resistance state or low-resistance state. If, for example, the first load resistor R1 is in a low resistance state, the first differential transistor Q1 is turned off and the second differential transistor Q2 is turned on, resulting in a first output (b) of the differential amplifier going to a higher voltage level. Corresponding, the second output (b̲) of the differential amplifier goes to a lower voltage level.

Application of an active (here, a higher voltage potential) RWL1 line signal, causes the first latch 710 to latch the state of the first and second outputs b, b̲. As shown in FIG. 8, the output (OUT1) of the first latch 710 goes to a high voltage potential. The previously marked (that is, previous to the assertion of the RWL1 line signal) cross-hatching of the output (OUT1) of the first latch 710 indicates a "don't care" condition.

The setup condition is re-established by re-asserting the VEQ signal and de-asserting the VH signal. After setup, the VEQ signal is de-asserted and the VH signal is re-asserted. If the resistive states of the first and second resistances R1, R2 has changed, (that is the first resistor R1 is high and the second resistor R2 is low) the first output b will go low, and second output b̲ will go high. Application of an active (here, a higher voltage potential) RWL2 line signal, causes the second latch 720 to latch the state of the first and second outputs b, b̲. As shown in FIG. 8, the output (OUT2) of the second latch 720 goes to a low voltage potential. The previously marked (that is, previous to the assertion of the RWL2 line signal) cross-hatching of the output (OUT2) of the second latch 720 indicates a "don't care" condition.

As shown in FIG. 8, the state first latch 710 is different than the state of the second latch 710, causing the output (INDICATOR) of the exclusive OR gate 740 to pulse high, indicating the detection of a resistance change in the resistors R1, R2.

Figure 9:
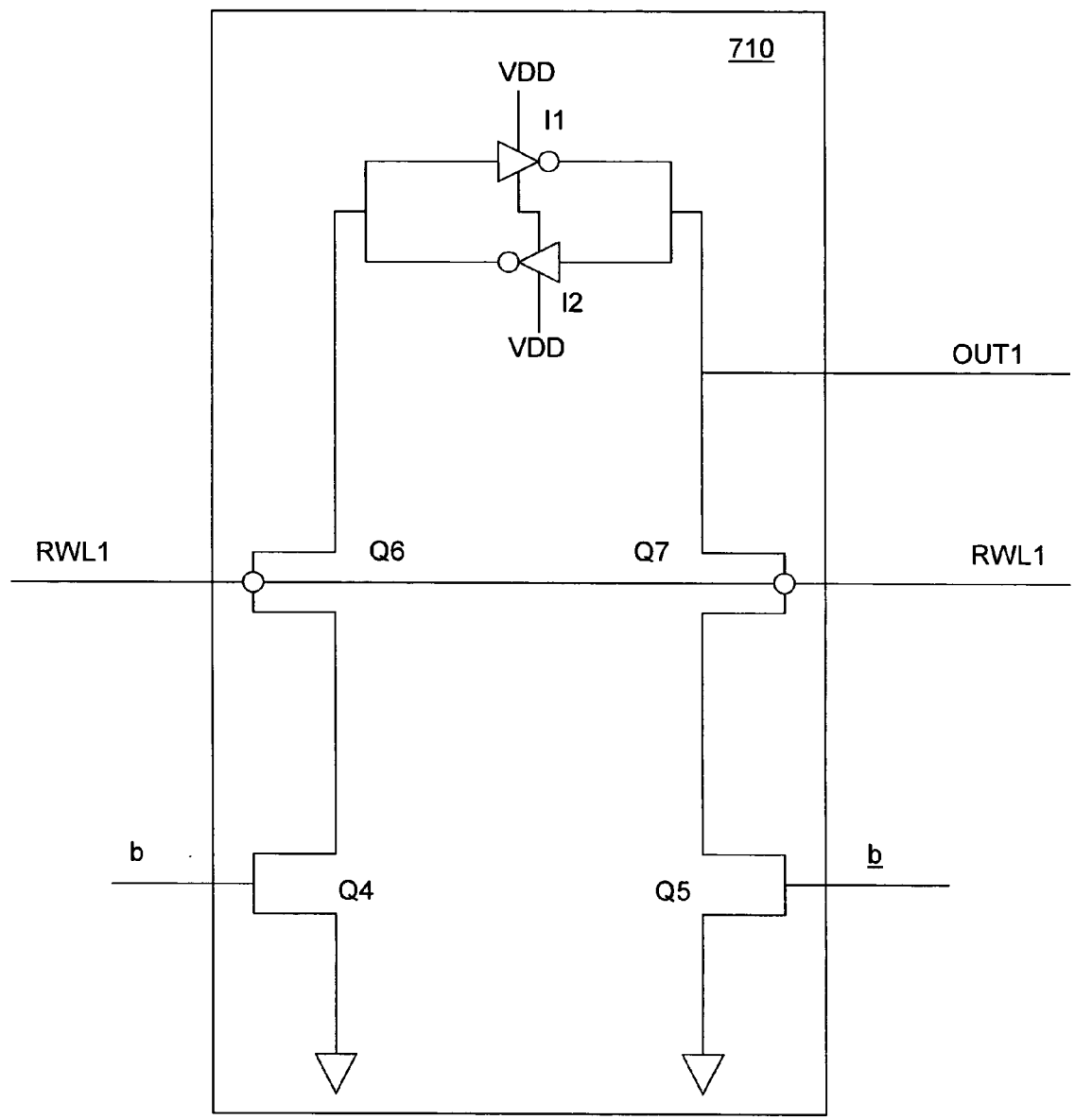
FIG. 9 shows is a circuit schematic of a latch that can be used within the resistance sensor of FIG. 7.

FIG. 9 shows is a circuit schematic of a latch (for example, latch 710) that can be used within the resistance sensor of FIG. 7. The latch circuitry causes the output (Out1) of the latch 710 to latch one of two possible states. A first state is latched when the b input is high and the b̲ input is low while the RWL1 control line pulses high. This condition causes transistors Q4 and Q6 to conduct, causing the output (OUT1) to be driven to a logically high state as determined by the supply voltage VDD. A second state is latched when the b input is low and the b̲ input is high while the RWL1 control line pulses high. This condition causes transistors Q5 and Q7 to conduct, causing the output (OUT1) to be driven to a logically low state.

Operation of the latches 710, 720 desirably allows the voltage VH that is applied to the resistances R1, R2 to be a non-standard voltage. This is useful because if the resistances R1, R2 are, for example, MRAM cells, the voltage VH is generally limited by a breakdown voltage of the MRAM cells. Exceeding the breakdown voltages of the MRAM cells could destroy the MRAM cells. This limitation on the applied control voltage VH can cause the voltage swings of the outputs b, b̲ to be much less than non-standard logical voltages. Proper selection of the transistors Q4, Q5, Q6, Q7 allows the transistors to properly conduct even though the signals b, b̲ may be less than 200 mV. The output (OUT1) of the latch 710, however, can include a full logical voltage swing of 5V or 3.3 V depending upon the logic family and the VDD supply voltage. As a result, the latch 710 provides latching of the states of the signals b, b̲, as well as providing a voltage translation of the signals b, b̲ to a standard logic voltage swing. The latch 710 can receive, non-standard input voltages and generate standard logic output voltages. Inverters I1, I2 form a basic cross-coupled latch.

Figure 10:
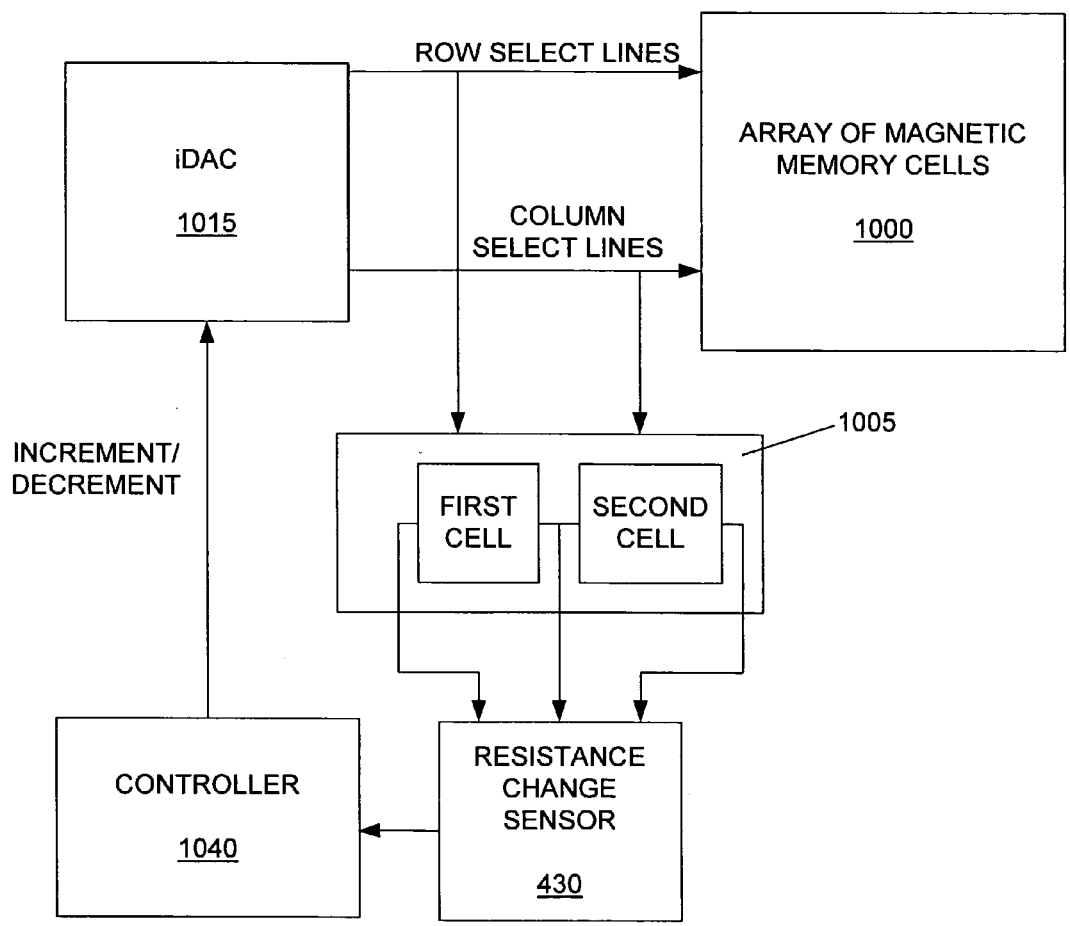
FIG. 10 shows greater detail of a write current generator according to an embodiment of the invention.

FIG. 10 shows greater detail of a write current generator. This embodiment includes a write generator circuitry for calculating a selected magnitude of the write current. The write current is generated by a current digital to analog converter (iDAC) 1015 and is magnetically coupled to a selected magnetic memory cell within an array of magnetic memory cells 1000, and to pair of complimentary test memory cells 1005. The test memory cells 1005 can be used to help determine an optimal write current. Here, both the row select and column select lines are connected to the test memory cells 1005 suggesting that both may be optimized. Generally, however, the write current of the column select lines is predetermined, and the write current of the row select lines is optimized.

A controller 1040 provides some control of a digital value within the write generator circuitry that is applied to the iDAC 1015 based upon resistance change detection of the resistance change sensor 430. The digital value of the write generator circuitry provides control of the magnitude of the write current. The controller 1040 in combination with the iDAC 1015 provides the functionality of the write current generator 420 of FIG. 4.

One variation of the embodiment of the write current determination circuitry includes a switching response of the test magnetic memory cells 1005 being used to determine a magnitude of the write current generated by the iDAC 1015. The switching response of the test magnetic memory cells 1005 determines the optimal write current range in which the write current is great enough to provide reliable writing to a selected memory cell within the array of magnetic memory cells 1000, but small enough that half select errors within the array of magnetic memory cells 1000 are minimized. Essentially the write current determination circuitry functions as a current regulator for ensuring that the write current generated by the write current generator is greater than a minimal magnitude of write current and less than a maximal magnitude of write current.

Figure 11:
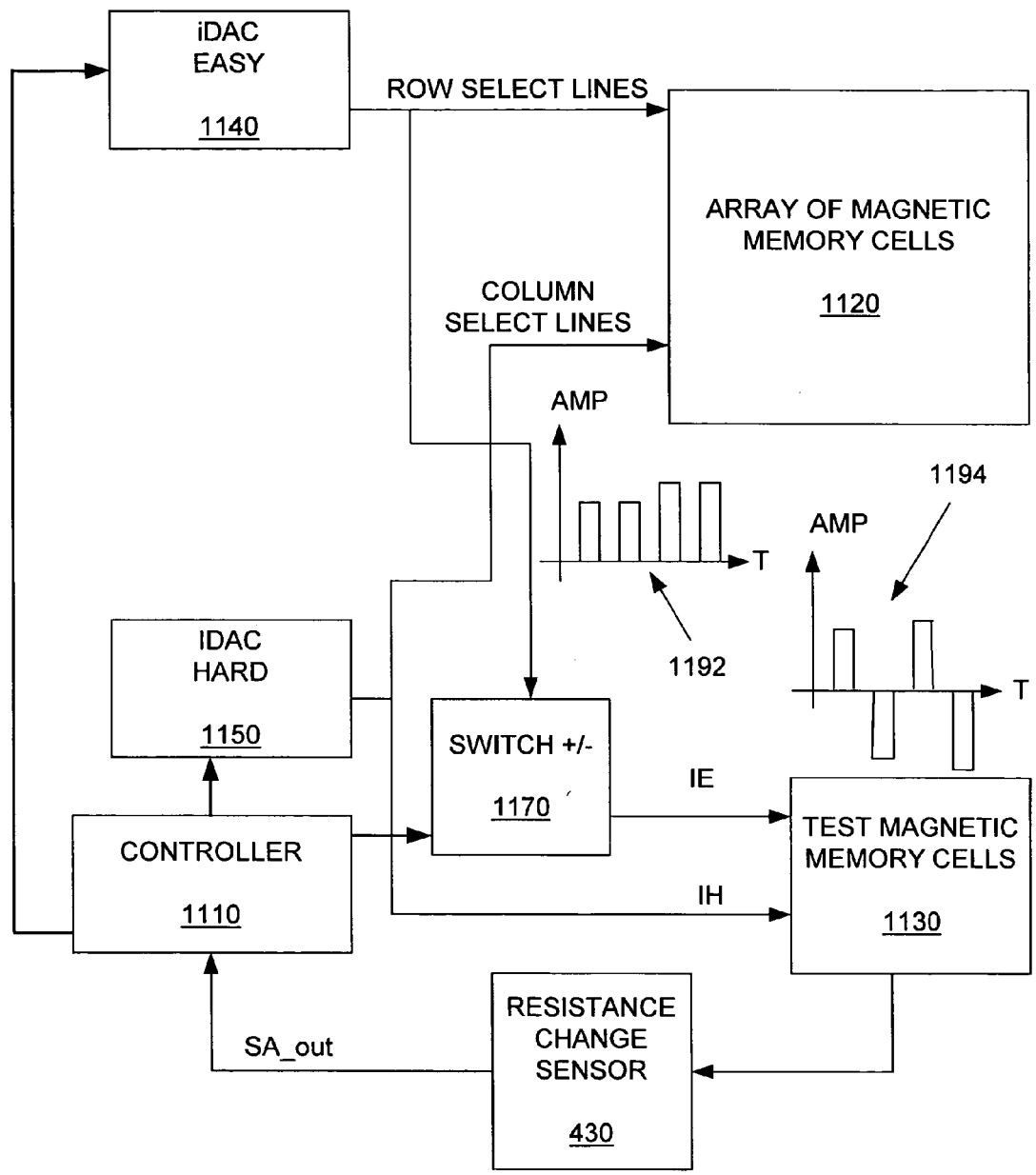
FIG. 11 shows even greater detail of a write current generator according to an embodiment of the invention.

FIG. 11 shows an embodiment similar to the embodiment of FIG. 10, but where the write current circuit is shown in greater detail. The write current generator of this embodiment includes an easy axis current digital to analog converter (iDAC) 1140 and a hard axis iDAC 1150. The easy axis iDAC 1140 and the hard axis iDAC 1150 generate a series of pulsed write signals as shown in the plot 1192. The pulses are pulses of current that induce a pulsed magnetic field. The outputs of the easy axis iDAC 1140 and the hard axis iDAC 1150 are connected to an associated array of magnetic memory cells 1120.

An easy axis switch 1170 receives the pulsed write signals (1192) of the easy axis iDAC 1140, and alternates that polarity of the pulses. That is, the easy axis switch 1170 generates a switch output that includes the pulsed write signal of the easy axis iDAC 1140 in which the polarity (positive and negative) of the pulsed signal (shown as 1194) alternates from one pulse to the next.

This embodiment does not include a hard axis switch. The uni-polarity pulsed write signals of the hard axis iDAC 1150 are coupled to test magnetic memory cells 1130.

The alternating polarity pulses of the easy axis iDAC 1140 and the easy axis switch 1170, provide an alternating polarity pulsed magnetic field that is aligned along the easy axis of the test magnetic memory cells 1130. The uni-polarity pulses of the hard axis iDAC 1150 provide a uni-polarity pulsed magnetic field that is aligned along the hard axis of the test magnetic memory cells 1130.

A controller 1110 provides (as well as other controls) timing and amplitude control of the easy axis IDAC 1140 and the hard axis IDAC 1150. A resistance change sensor 430 senses changes in the logical states of the magnetic memory cells 1130. The resistance change sensor 430 is connected to the controller 1110, so the controller 1110 can determine the logical state of the test magnetic memory cells 1130.

One mode of operation includes the controller setting the hard axis IDAC 1150 to a default value. The default value is experimentally determined, or estimated through computer simulation. The controller then zeroes the easy axis current, and then increments the easy axis iDAC 1140. The iDAC 1140 is incremented until the controller senses that a test magnetic memory cell has changed its state due to the alternating pulsed magnetic field created by the easy axis IDAC 1140.

A resistance change sensor 430 similar to the resistance change sensor circuit shown in FIG. 7 is used to monitor the state of the resistance of the test magnetic memory cells 1130 in response to the alternating write pulses 1194 that are applied to the test memory cells 1130. An output from the resistance change sensor (SA_out) is feedback to the controller 1110. The controller 1110 varies the magnitude of the easy axis write current as determined by the ability of the pulsed write current to write (change the state of) to the test magnetic memory cells 1130, and thereby control the write current to be within the acceptable write current limits as depicted in FIG. 3.

Figure 12:
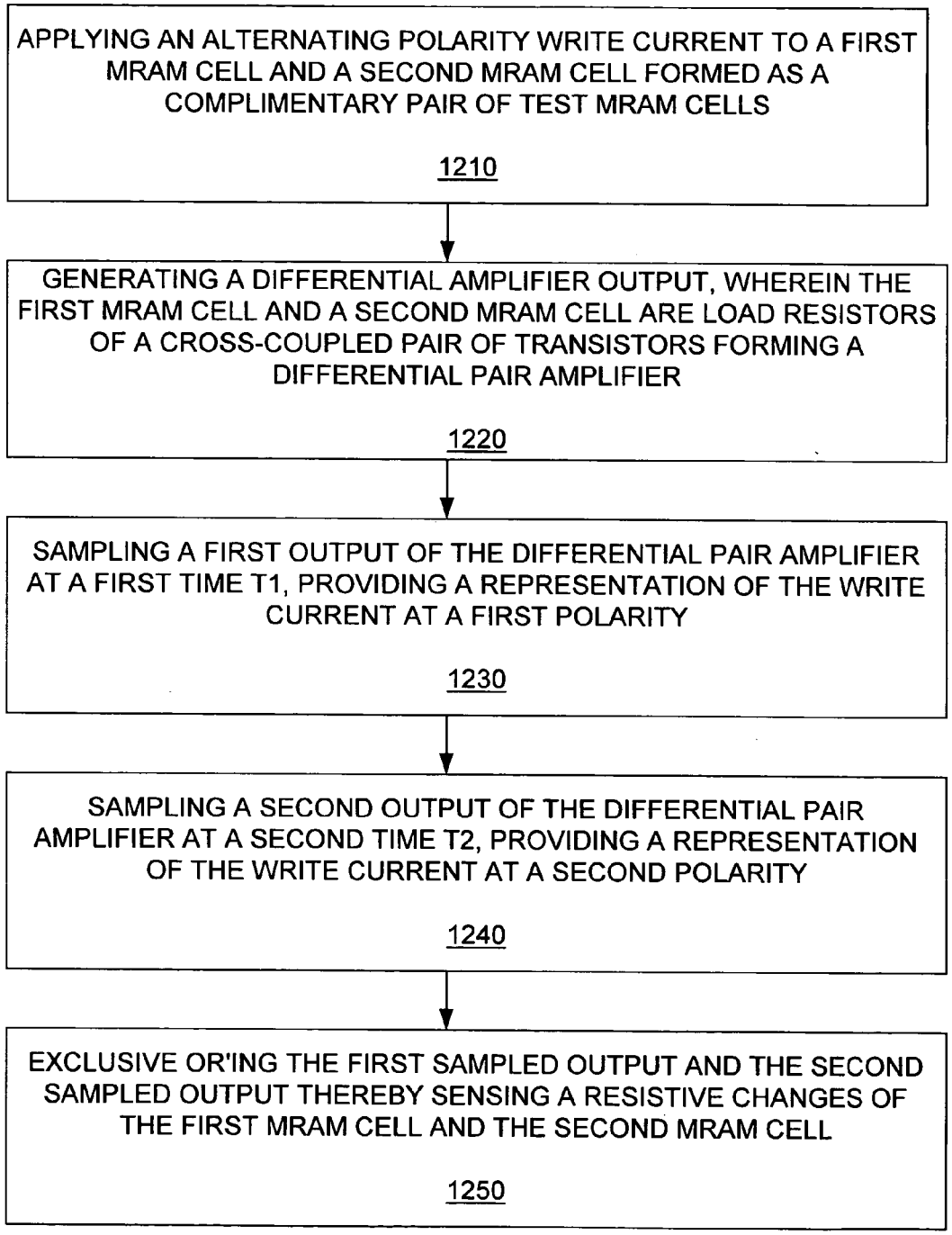
FIG. 12 is a flow chart that includes steps of a method of sensing a resistive change, according to an embodiment of the invention.

FIG. 12 is a flow chart that includes steps of a method of sensing a magnitude of a MRAM write current. A first step 1210 includes applying an alternating polarity write current to a first MRAM cell and a second MRAM cell formed as a complimentary pair of test MRAM cells. A second step 1220 includes generating a differential amplifier output, wherein the first MRAM cell and a second MRAM cell are load resistors of a cross-coupled pair of transistors forming a differential pair amplifier. A third step 1230 includes sampling a first output of the differential pair amplifier at a first time t1, providing a representation of the write current at a first polarity. A fourth step 1240 includes sampling a second output of the differential pair amplifier at a second time t2, providing a representation of the write current at a second polarity. A fifth step 1250 includes exclusive OR'ing the first sampled output and the second sampled output thereby sensing a resistive changes of the first MRAM cell and the second MRAM cell.

Figure 13:
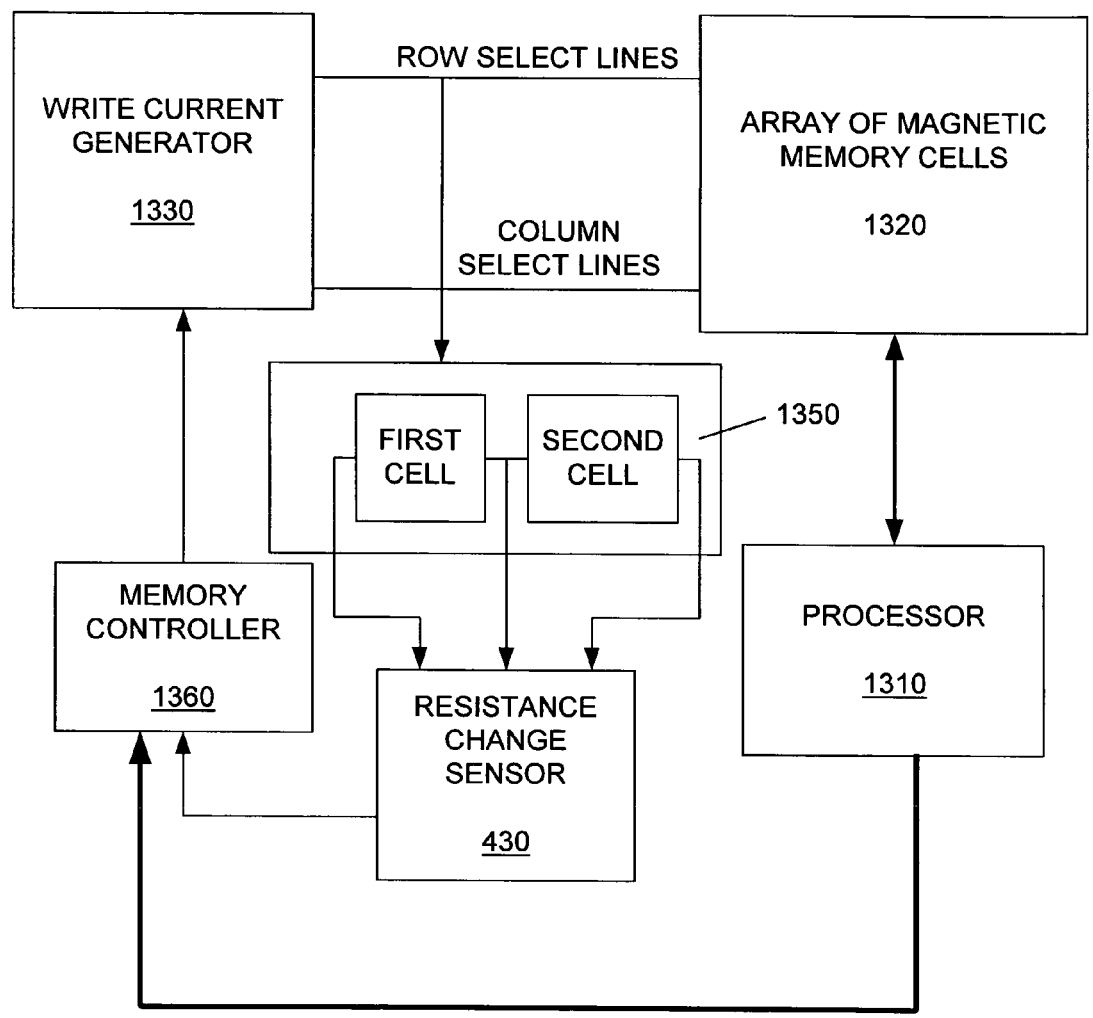
FIG. 13 shows a computing system that includes a write current generator utilizing a resistance change sensor, according to an embodiment of the invention.
Figure 14:
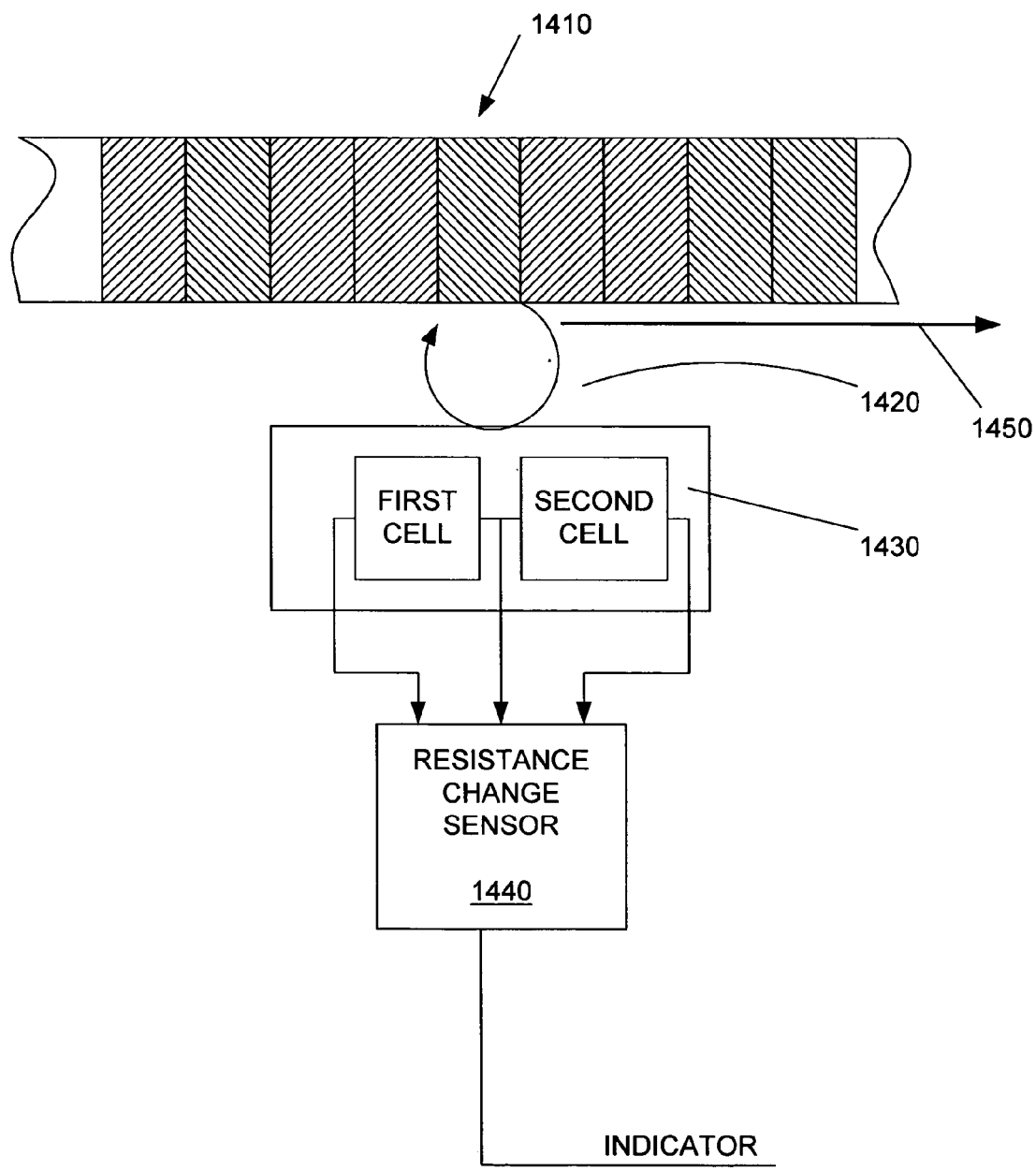
FIG. 14 shows a TMJ resistance sensor utilized for sensing magnetic states of a magnetic medium, according to an embodiment of the invention.

FIG. 13 shows one embodiment of a computing system that includes a processor 1310 interfaced with magnetic memory. The magnetic memory includes an array of magnetic memory cells 1320, and a write current generator 1330 for generating a write current for writing to selected memory cells within the array of magnetic memory cells 1320. Complimentary test memory cells 1350 are connected to a resistance change sensor 1340. The resistance change sensor 1340 is connected to a memory controller 1360 which controls adjustments to the write current based upon detection of changes in the states of the complimentary test memory cells 1350. The memory controller 1360 also provides an interface between the processor 1310 and the magnetic memory cells 1320.

The example embodiments have been described in the context of a write current generator. However, it is to be understood that many different systems and devices can incorporate a resistance change sensor. For example, FIG.

14 shows a TMJ resistance sensor utilized for sensing magnetic states of a magnetic medium 1410. Exemplary magnetic mediums 1410 include a magnetic tape or a magnetic disk. In either case, the magnetic medium 1410 generates a magnetic field 1420 that represents a magnetic state. As TMJ cells 1430 pass by the magnetic medium 1410 (as depicted by arrow 1450) first and second memory cells of the TMJ cells 1430 are magnetically oriented as determined by the magnetic field 1420 generated by the magnetic medium 1410. Changes in magnetic orientations of the TMJ cells can be sensed by a resistance change sensor, indicating changes in orientation of the detected magnetic field 1420. The changes in the orientation of the detected magnetic field 1420 indicate bit changes detected in bits stored within the magnetic medium 1410.

Although specific embodiments of the invention have been described and illustrated, the invention is not to be limited to the specific forms or arrangements of parts so described and illustrated. The invention is limited only by the appended claims.

What is claimed is:

1. A resistance change sensor, comprising:
 a first input connected to a first resistance; the first resistance variable between a low resistance and a high resistance;
 a second input connected to a second resistance; the second resistance variable between a low resistance and a high resistance;
 a resistance detector for sensing a resistive change in at least one of the first resistance and the second resistance wherein the first resistance and the second resistance are load resistors of a cross-coupled pair of transistors forming a differential pair amplifier of the resistance change sensor.

2. A resistance change sensor, comprising:
 a first input connected to a first resistance; the first resistance variable between a low resistance and a high resistance;
 a second input connected to a second resistance; the second resistance variable between a low resistance and a high resistance;
 a resistance detector far sensing a resistive change in at least one of the first resistance and the second resistance wherein the resistive change is sensed by sampling a resistive state of the first resistance and the second resistance at a first time t1, and sampling the resistive state of the first resistance and the second resistance at a second time t2.

3. The resistance change sensor of claim 2, wherein the resistive state sampled at first time t1 is stored in a first latch, and the resistive state sampled at the second times t2 is stored in a second latch.

4. The resistance change sensor of claim 3, wherein an output of the first latch and an output of the second latch are exclusively OR'd by an exclusive OR gate generating the sensor output.

5. The resistance change sensor of claim 3, wherein the first latch and the second latch comprise transistors that are formed so that the first latch and the second latch can latch non-standard voltage potential input signals while providing output signals that are standard voltage potential signals.

6. A magnetic sensing device comprising:
 a first sensor input connected to a first tunneling magnetoresistive (TMJ) cell, the first TMJ cell including a first resistance;
 a second sensor input connected to a second TMJ cell, the second TMJ cell including a second resistance; the second TMJ formed complimentary to the first MJT cell; and
 a detector for sensing a change in resistance of the first TMJ cell and the second TMJ cell
wherein the first TMJ cell and the second TMJ cell are load resistors of a cross-coupled pair of transistors forming a differential pair amplifier of the magnetic sensing device.

7. A magnetic sensing device comprising:
 a first sensor input connected to a first tunneling magnetoresistive (TMJ) cell, the first TMJ cell including a first resistance;
 a second sensor input connected to a second TMJ cell, the second TMJ cell including a second resistance; the second TMJ formed complimentary to the first MJT cell; and
 a detector for sensing change resistance of the first TMJ cell and the second TMJ cell the resistive change is sensed by sampling a resistive state of the first TMJ cell and the second TMJ cell at a first time t1, and sampling the resistive state of the first TMJ cell and the second TMJ cell at a second time t2.

8. The device of claim 7, wherein the resistive state sampled at first time t1 is stored in a first latch, and the resistive state sampled at the second time t2 is stored in a second latch.

9. The device of claim 8, wherein an output of the first latch and an output of the second latch are exclusively OR'd by an exclusive OR gate generating a device output.

10. The device of claim 8, wherein the first latch and the second latch comprise transistors that are formed so that the first latch and the second latch can latch non-standard voltage potential input signals while providing output signals that are standard voltage potential signals.

11. A memory apparatus comprising an array of MRAM cells; a write current generator for generating a write current for selectively writing to MRAM cells within the array of MRAM cells; a complimentary pair of test MRAM cells additionally coupled to the write current of the write current generator, a complimentary MRAM cell resistive state sensor connected to the complimentary pair of test MRAM cells for detecting a change in resistance of the complimentary pair of test MRAM cells.

12. The apparatus of claim 11, wherein the write current includes pulses that alternate in polarity.

13. The apparatus of claim 11, wherein the complimentary pair of test MRAM cells includes a first MRAM cell and a second MRAM cell, wherein the first MRAM cell and a second MRAM cell are load resistors of a cross-coupled pair of transistors forming a differential pair amplifier of the complimentary MRAM cell pair resistive state sensor.

14. The apparatus of claim 13, the resistive change is sense by sampling a resistive state of the first MRAM cell and the second MRAM cell at a first time t1, and sampling the resistive state of the first MRAM cell and the second MRAM cell at a second time t2.

15. The apparatus of claim 14, wherein the resistive state sampled at first time t1 is stored in a first lath, and the resistive state sampled at the second time t2 is stored in a second latch.

16. The apparatus of claim 15, wherein an output of the first latch and an output of the second latch are exclusively OR'd by an exclusive OR gate generating the sensor output.

17. The apparatus of claim 15, wherein the first latch and the second latch comprise transistors that are formed so that the first latch and the second latch can latch non-standard voltage potential input signals while providing output signals that are standard voltage potential signals.

18. A method of sensing a magnitude of a MRAM write current comprising:

applying an alternating polarity write current to a first MRAM cell and a second MRAM cell formed as a complimentary pair of test MRAM cells;

generating a differential amplifier output, wherein the first MRAM cell and the second MRAM cell are load resistors of a cross-coupled pair of transistors forming a differential pair amplifier;

sampling a first output of the differential pair amplifier and at first time t1, providing a representation of the write current at a first polarity;

sampling a second output of the differential pair amplifier at a second time t2, providing a representation of the write current at a second polarity;

exclusively OR'ing the first sampled output and the second sampled output thereby sensing a resistive changes of the first MRAM cell and the second MRAM cell.

19. The method of claim 18, wherein first MRAM cell and the second MRAM cells change resistive states when the magnitude of the MRAM write current exceeds a write current threshold, and the exclusively OR's output provides a threshold indicator.

20. A method of sensing a change of magnetic states using TMJ sensing elements, comprising:

applying a first magnetic field to the TMJ sensing elements;

sensing a first resistance state of a first TMJ element and a second TMJ element of the TMJ sensing elements;

storing the first resistance state;

applying a second magnetic field to the TMJ sensing elements;

sensing a second resistance state of a first TMJ element and a second TMJ element of the TMJ sensing elements;

storing the second resistance state; and exclusive OR'ing the first resistance state and the second resistance state determining whether the first resistance state is different than the second resistance state.

21. The method of claim 20, wherein the first magnetic field is generated when the TMJ sensing elements are proximate a first location of a magnetic medium, and the second magnetic field is generated when the TMJ sensing elements are proximate a second location of the magnetic medium.

22. An apparatus for sensing a change of magnetic states using TMJ sensing elements, comprising:

means for applying a first magnetic field to the TMJ sensing elements;

means for sensing a first resistance state of a first TMJ element and a second TMJ element of the TMJ sensing elements;

means for storing the first resistance state;

means for applying a second magnetic field to the TMJ sensing elements;

means for sensing a second resistance state of a first TMJ element and a second TMJ element of the TMJ sensing elements;

means for storing the second resistance state; and means for exclusive OR'ing the first resistance state and the second resistance state determining whether the first resistance state is different than the second resistance state.

23. A magnetic sensing device comprising:

a first sensor input connected to a first tunneling magneto-resistive (TMJ) cell, the first TMJ cell including a first resistance;

a second sensor input connected to a second TMJ cell, the second TMJ cell including a second resistance; the second TMJ formed complimentary to the first TMJ cell; and a detector for sensing a change in resistance of the first TMJ cell and the second TMJ cell wherein the first TMJ cell is formed complimentary to the second TMJ cell.

* * * * *